Figure 1:
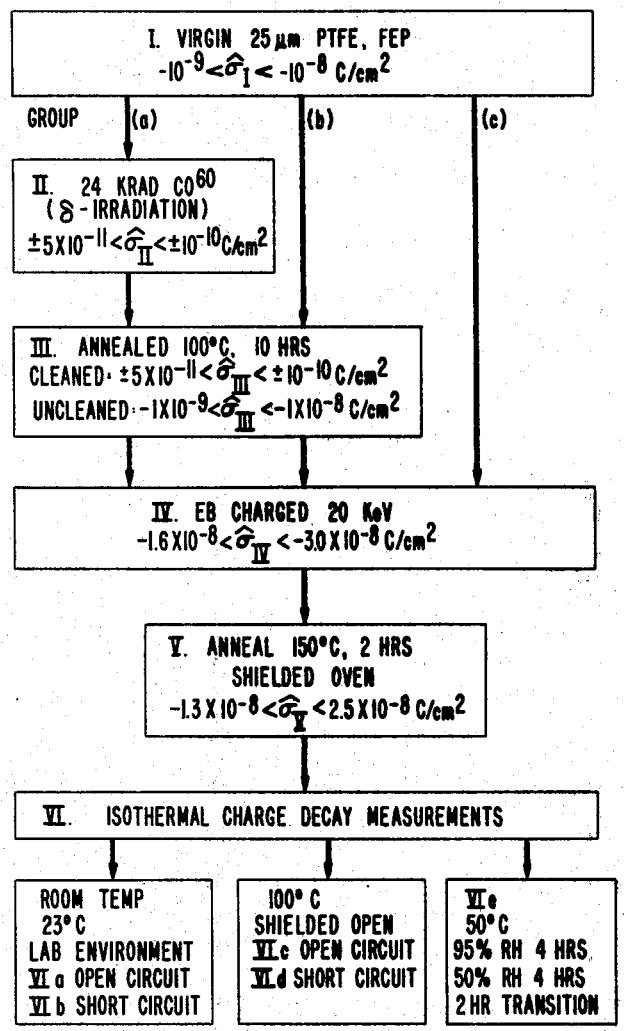

United States Patent [19]

West

[11] 4,248,808
[45] Feb. 3, 1981

[54] TECHNIQUE FOR REMOVING SURFACE AND VOLUME CHARGES FROM THIN HIGH POLYMER FILMS

[75] Inventor: James E. West, Readington, N.J.

[73] Assignee: Bell Telephone Laboratories, Incorporated, Murray Hill, N.J.

[21] Appl. No.: 974,334

[22] Filed: Dec. 29, 1978

[51] Int. Cl.³ ............................................. G11C 13/02
[52] U.S. Cl. .................................... 264/22; 264/235; 264/346; 307/400
[58] Field of Search ..................... 264/22, 25, 26, 235, 264/346; 307/400; 204/159.17

[56] References Cited

U.S. PATENT DOCUMENTS

| | | | |
|---|---|---|---|
| 2,801,389 | 7/1957 | Linder | 332/68 |
| 3,170,858 | 2/1965 | Muehlberg et al. | 264/22 |
| 3,644,605 | 2/1972 | 264 | 22/ |
| 3,924,324 | 12/1975 | Kodera | 307/400 |

OTHER PUBLICATIONS

"The Electret", F. Gutmann, Reviews of Modern Physics, vol. 20, No. 3, Jul. 1948, pp. 457–472.

Primary Examiner—Jeffery R. Thurlow
Attorney, Agent, or Firm—Peter V. D. Wilde

[57] ABSTRACT

A technique for removing surface charges from thin film electret foils involves subjecting the foil to penetrating radiation of a dosage ranging from 1–25 krad and, subsequently, annealing the foil at a temperature ranging from 80°–150° C.

10 Claims, 3 Drawing Figures

TECHNIQUE FOR REMOVING SURFACE AND VOLUME CHARGES FROM THIN HIGH POLYMER FILMS

This invention relates to a technique for removing surface and volume charges from thin high polymer films. More particularly, the present invention relates to a technique for removing trapped charges from fluorinated polymers of the type employed in electret applications.

In recent years, considerable interest has been generated in a class of structures commonly termed "foil electrets", such structures being of interest for use in electrometers, dosimeters and as the vibratile diaphragm of electroacoustic transducers. Typically, these foil electrets comprise a metallized thin foil of a fluorinated ethylene-propylene copolymer or polytetrafluoroethylene, such compositions being marketed commercially under the trade name of "Teflon FEP" or "Teflon", respectively. Conversion of the foil to an electret is effected by electron beam radiation, corona discharge or other related charge injection techniques.

Studies have revealed that the foregoing charge injection techniques oftimes do not result in a uniform charge distribution on the surface of the foil, such being attributable to the presence of large (about $10^{-8}$ C/cm$^2$) residual volume and surface charges acquired during the manufacturing or handling process. These charges, which are trapped at different levels in the foil, typically in deep traps that cannot be released below the material melt temperature due to the intrinsically low conductivity of the polymer, are usually spatially nonuniform and are caused either by friction, static electrification or radiation. Unfortunately, in many device applications, as, for example, in electrets, capacitors, integrated circuits and the like, these charges result in less than optimal performance. Heretofore, several attempts were made to either reduce or compensate such charges, annealing below the melting point of the material being the most promising procedure. However, these attempts have not been entirely satisfactory and efforts have continued with a view toward development of alternative techniques.

In accordance with the present invention, this end is attained by means of a novel technique which involves temporarily increasing the conductivity of the polymer, thereby permitting trapped electrons and holes to recombine or move freely out of the polymer. Briefly, the inventive technique involves subjecting the polymer of interest to penetrating radiation, for example, from a gamma cell, x-radiation and the like with a dosage ranging from 1 to 25 krad, thereby generating secondary carriers and creating a conductive path for the residual charges. The low conductivity of the polymer may then be restored by annealing for several hours at elevated temperatures. The residual charge density of polymers so treated is of the order of $10^{-10}$ C/cm$^2$ and the polymers may then be charged to a desired charge density utilizing, for example, a non-penetrating electron beam.

Figure 2:
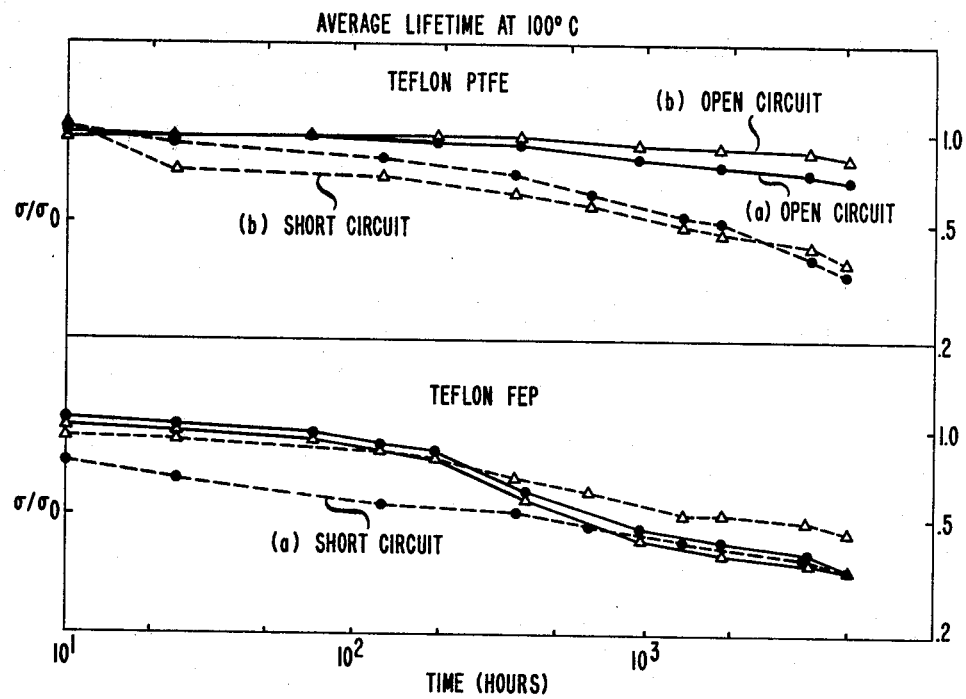
Figure 3:
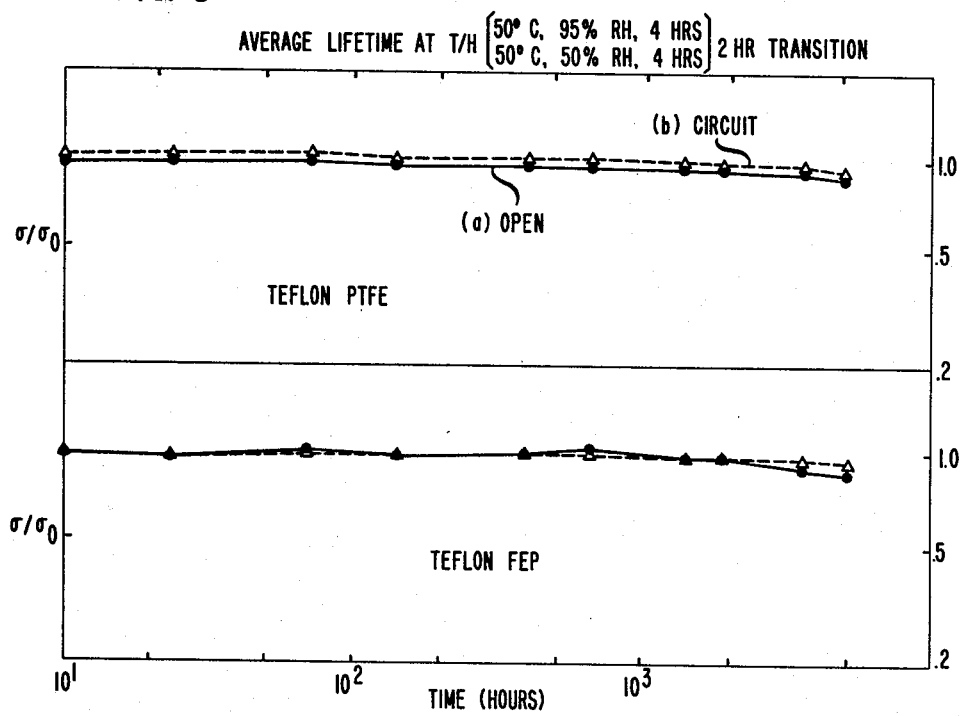

The invention will be more readily understood by reference to the following detailed description taken in conjunction with the accompanying drawing wherein:

FIG. 1 is a block diagram showing the processing sequence of polytetrafluoroethylene polymers and fluorinated ethylene propylene copolymers in accordance with the present invention and in accordance with conventional prior art procedures;

FIG. 2 is a graphical representation on coordinates of time in hours against charge decay showing the isothermal charge decay after controlled charging of 25 micrometer electret foils of the invention as a function of time at 100 degrees C.; and FIG. 3 is a graphical representation on coordinates of time in hours against charge decay after controlled charging showing the average charge decay of 25 micrometer electret foils of the invention at 50 degrees C. with humidity cycling from 95 to 50 percent relative humidity.

In the fabrication of a thin film electret in accordance with the present invention, a fluorinated polymeric foil having a thin layer of a metal as, for example, gold or aluminum, having an undesirable residual charge density ranging from $-10^{-9}$ to $-10^{-8}$ C/cm$^2$ introduced during the manufacturing process is employed. An exemplary charging process utilized to demonstrate the method involves bombarding the non-metallized surface of such foil with a scanned or diffused mono-energetic electron beam having an energy ranging from 2.5 to 40 keV and an intercepted charge density greater than $10^{-9}$ coulombs/cm$^2$. Following, the charged foil is subjected to a source of penetrating radiation as, for example, a cobalt 60 cell, with a dosage ranging from 0.1 to 25 krad, so resulting in the generation of a large number of secondary carriers in the material and the formation of a conductive path for residual charges. Following, the low level of conductivity of the polymer is restored by annealing in an oven maintained at a temperature ranging from 80 to 150 degrees C. for a time period ranging from 0.5 to 10 hours. Isothermal studies and thermally stimulated current measurements of foils so treated and then charged in a controlled manner reveal that the charge storage properties thereof are not modified and are comparable to non-irradiated foils.

An example of the practice of the present invention is set forth below. It will be understood by those skilled in the art that this example is merely for purposes of exposition and it is not to be construed as limiting.

EXAMPLE

Tetrafluoroethylene and fluorinated ethylenepropylene copolymers, 25 micrometers in thickness, having a 1000 Å aluminum electrode on one side thereof, were cut into circular samples 8.7 cm in diameter from stock rolls 10 cm in width and frames in 50-micrometer-thick cardboard rings, the samples having initial residual surface charge densities ranging from $-10^{-9}$ to $-10^{-8}$ C/cm$^2$. These samples were arbitrarily divided into three groups and treated in the manner shown in the block diagram of FIG. 1. The samples in the group designated (a) were irradiated with a dose of 24 krad in a cobalt 60 gamma cell and then annealed in a shielded oven for ten hours at 100 degrees C. The samples in group (b) were annealed only and the samples in group (c) were untreated.

The residual charge density of samples in group (a), treated by gamma irradiation, was reduced to values ranging from $\pm 5 \times 10^{-11}$ to $\pm 10 \times 10^{-10}$ C/cm$^2$ and those values remained constant after annealing. Following measurement of the charge density, the samples were charged in a controlled manner to a value ranging from 1.6 to $3.0 \times 10^{-8}$ C/cm$^2$ using a nonpenetrating monoenergetic 20 keV electron beam. Then, all the samples were again annealed in open circuit (polymer surface free) at 150° C. for two hours to eliminate the delayed radiation-induced conductivity in the irradiated volume due to the charging electron beam. This annealing step resulted in a slight reduction in the measured surface charge due to charge movement into the material as a result of the trap-modulated mobility.

Following, the samples so obtained were studied under elevated temperature isothermal conditions and also in a humid atmosphere under open circuit (polymer surface free) and short circuit (polymer surface contacted at some points) using an aluminum electrode.

In the elevated temperature studies, for open circuit conditions, the samples were stacked in brass double-locked cans with metal separators holding them in place. In the open circuit studies, the samples and aluminum electrodes were stored in similar containers. Studies were conducted at 100° C. for $5 \times 10^3$ hours. The samples were permitted to cool to room temperature prior to surface charge measurements.

With reference now to FIG. 2, there is shown a graphical representation on coordinates of time in hours against charge decay for open circuit and short circuit conditions of the noted fluorinated polymers. It should be noted that the fluorinated ethylene-propylene copolymer evidences a stepwise decay in open circuit storage for gamma irradiated annealed samples (a) and for annealed samples (b), such decay corresponding with known results at 150° C. The time constant of the step is of the order of 20 days as compared to 2 days at 150° C., such characteristics supporting the likelihood of multiple trap levels. Similar behavior was evidenced by polytetrafluoroethylene (PTFE) absent the step.

Under the short circuit conditions, both groups of samples evidenced similar behavior, the short circuit decay for the PTFE being faster than the open circuit case due to the presence of larger fields in the free surface direction.

It is also to be noted that strong similarities exist between the gamma irradiated group (a) and the nonirradiated group (b). In both cases, samples from group (c) (not plotted) correspond exactly with the annealed group (b) samples.

FIG. 3 reveals that humidity cycling between 95 and 50 percent relative humidity at 50° C. has little effect on the charge density for the sample studied under open and short circuit conditions. Similarly, it may be noted that the effect of gamma irradiation (group (a)) has a limited effect upon charge decay.

The foregoing results clearly reveal that the residual charge normally found on most polytetrafluoroethylene and fluorinated ethylene-propylene copolymer which results from the manufacturing process can be eliminated by small doses of irradiation and by subsequently annealing without significantly altering charge storage properties. The elevated temperature and high humidity studies further reveal that the end result is to obtain a product having characteristics similar to unprocessed or virgin samples, so indicating that the foil materials need not be preselected with low residual charges to obtain uniformity of desired charge and that the described process may be used without damaging long time charge storage properties of the material.

I claim:

1. A technique for reducing surface charges on a fluorinated polymer thin film having a surface charge density greater than $10^{-9}$ C/cm² characterized by steps comprising
   (a) subjecting said film to penetrating radiation of a dosage ranging from 1 to 25 krad, in order to increase the conductivity of the film, and
   (b) annealing the film at a temperature ranging from 80° to 150° C. in order to substantially restore the low conductivity of the film, thereby producing a film having a residual surface charge density less than $10^{-9}$ C/cm².

2. Technique in accordance with claim 1 wherein the source of radiation is a cobalt 60 cell.

3. Technique in accordance with claim 1 wherein the source of radiation is x-radiation.

4. Technique in accordance with claim 1 wherein the duration of annealing ranges from 0.5 to 10 hours.

5. Technique in accordance with claim 1 wherein the fluorinated polymer is polytetrafluoroethylene.

6. Technique in accordance with claim 1 wherein the fluorinated polymer is an ethylene-propylene copolymer.

7. A method for making a thin film electret comprising the steps of injecting charge into a fluorinated polymer thin film having a thin layer of a metal deposited upon at least one surface thereof in order to produce a film having an intercepted charge density greater than $10^{-9}$ C/cm², and annealing the charged film, characterized by steps prior to said step of injecting charge comprising subjecting the film to penetrating radiation of a dosage ranging from 1 to 25 krad, in order to increase the conductivity of the film, and annealing the film at a temperature ranging from 80° to 150° C. in order to substantially restore the low conductivity of the film, thereby producing prior to said step of injecting charge a film having a residual surface charge density less than $10^{-9}$ C/cm².

8. The method of claim 7 further characterized in that the source of said penetrating radiation is cobalt 60.

9. The method of claims 7 or 8 further characterized in that the fluorinated polymer is polytetrafluoroethylene or an ethylene-propylene copolymer.

10. The method of claim 9 further characterized in that the step of annealing the film at a temperature ranging from 80 to 150 degrees C. has a duration in the range from 0.5 to 10 hours.

* * * * *